United States Patent [19]

De La Moneda et al.

[11] Patent Number: 4,458,406

[45] Date of Patent: Jul. 10, 1984

[54] MAKING LSI DEVICES WITH DOUBLE LEVEL POLYSILICON STRUCTURES

[75] Inventors: Francisco H. De La Moneda, Tucson, Ariz.; Thomas A. Williams, Reston, Va.

[73] Assignee: IBM Corporation, Armonk, N.Y.

[21] Appl. No.: 310,337

[22] Filed: Oct. 9, 1981

Related U.S. Application Data

[62] Division of Ser. No. 108,074, Dec. 28, 1979.

[51] Int. Cl.³ .................. H01L 21/225; H01L 21/265; H01L 21/28
[52] U.S. Cl. .................. 29/571; 29/577 C; 29/576 B; 29/578
[58] Field of Search .................. 148/187, 188; 29/571, 29/577 C, 576 B, 578

[56] References Cited

U.S. PATENT DOCUMENTS

| | | | |
|---|---|---|---|
| 3,914,855 | 10/1975 | Cheney et al. | 357/41 X |
| 3,958,323 | 5/1976 | De La Moneda | 29/578 X |
| 4,056,810 | 11/1977 | Hart et al. | 357/35 X |
| 4,075,045 | 2/1978 | Rideout | 148/187 |
| 4,207,585 | 6/1980 | Rao | 29/571 X |
| 4,240,195 | 12/1980 | Clemens et al. | 29/571 |
| 4,380,863 | 4/1983 | Rao | 148/187 X |

Primary Examiner—G. Ozaki
Attorney, Agent, or Firm—Maurice H. Klitzman; John E. Hoel

[57] ABSTRACT

The high resistance of diffused electrical interconnection lines used for ground return paths in MOS field effect transistor (MOSFET) arrays limits their size and performance. Advantage is taken of the extra interconnection level available from conventional double-layer-polycrystalline silicon (polysilicon) processes to distribute ground potential to arrays, by means of a polycrystalline grid with direct contact to diffused electrodes therein, thus greatly reducing the deleterious effects of ground resistance. The proposed ground grid is integrated into the structure of a MOSFET ROM using a typical double polysilicon process. The first polysilicon level provides the conductive medium for said ground grid and the diffusing doping impurities that form contiguous source electrodes for the array MOSFETs. Gate electrodes thereof and word lines are formed out of the second polysilicon level. Drain electrodes are diffused and contacted by metallized output lines.

3 Claims, 9 Drawing Figures

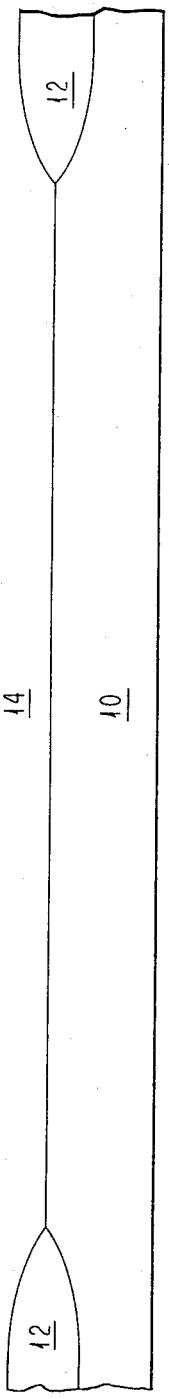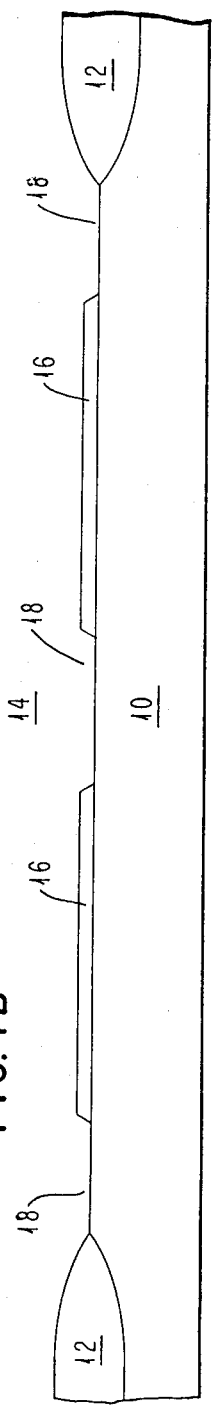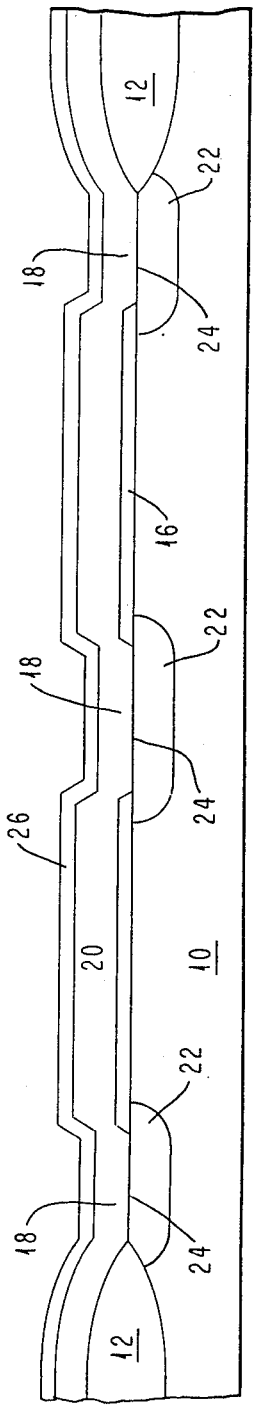

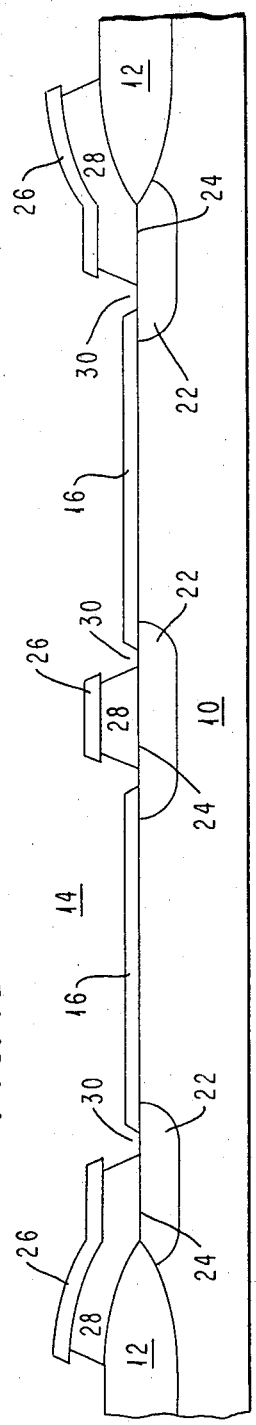
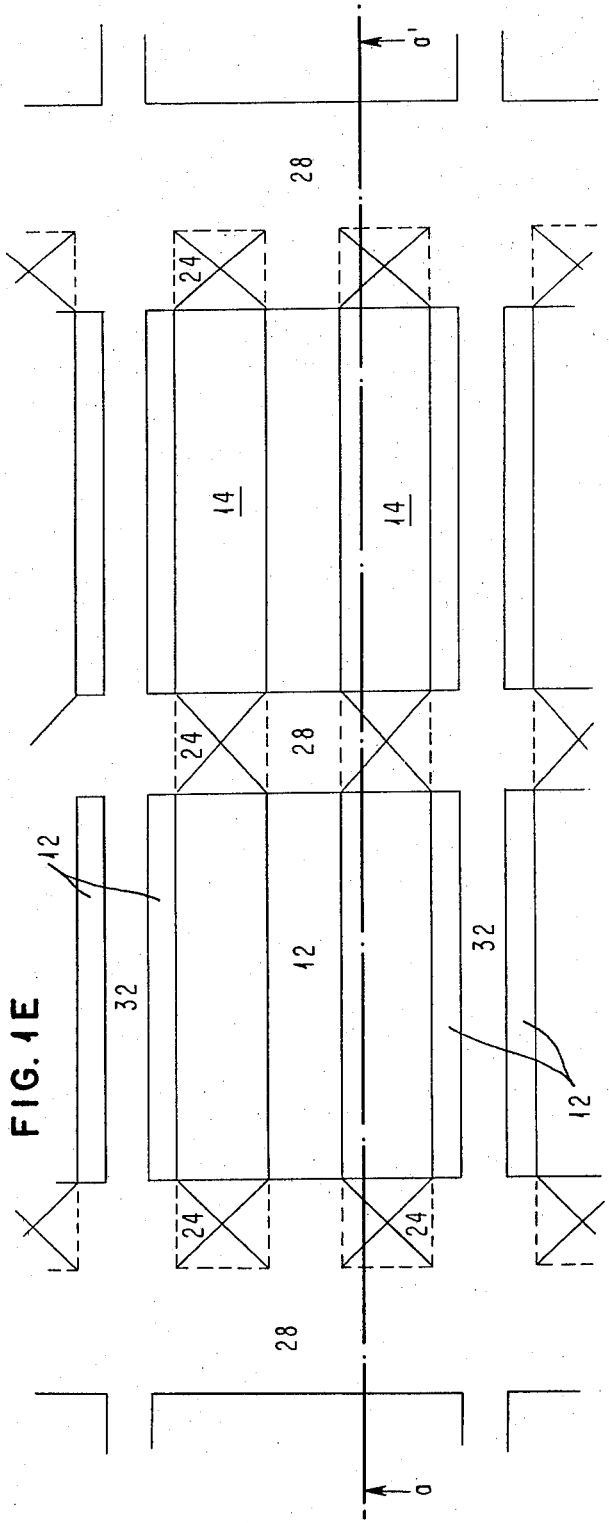

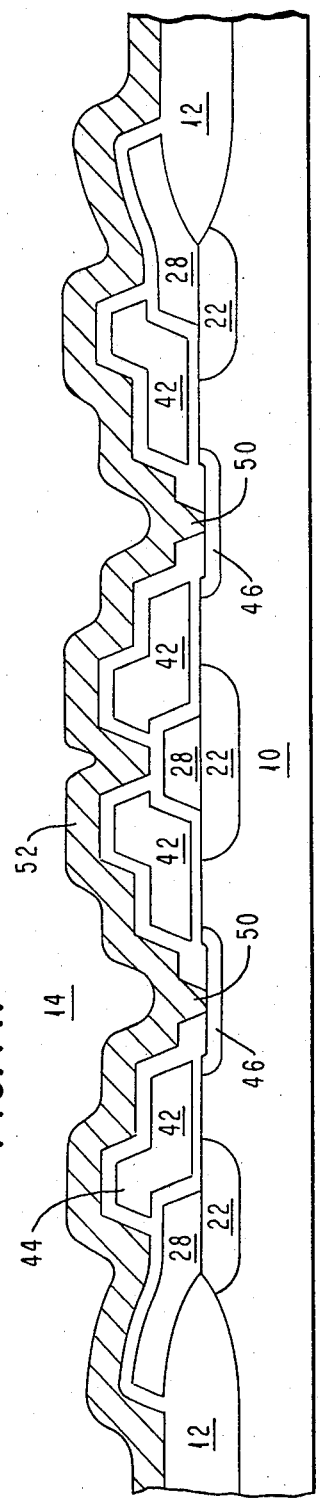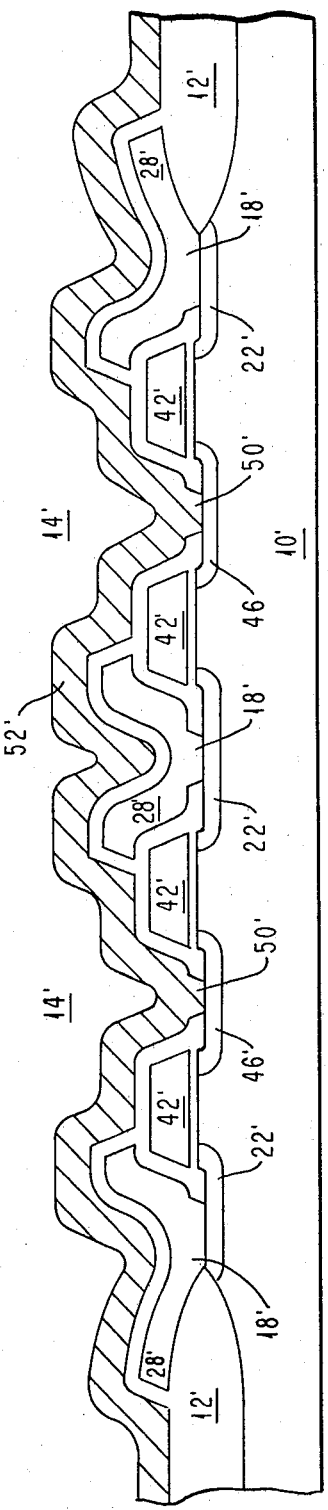

MAKING LSI DEVICES WITH DOUBLE LEVEL POLYSILICON STRUCTURES

This application is a division of a copending application, Ser. No. 180,074, filed Dec. 28, 1979.

FIELD OF THE INVENTION

The invention disclosed broadly relates to semiconductor devices and more particularly relates to an improvement in large scale integrated circuit devices.

BACKGROUND OF THE INVENTION

A major obstacle which has confronted the prior art in improving the performance of large MOSFET arrays is the resistance of interconnection paths or buses to ground potential when they are implemented using state-of-the-art diffused or polycrystalline lines. The ohmic resistance of these lines causes an inverse relationship between the array size and its circuit performance parameters such as access time, noise tolerance, and temperature operating range. As the array size increases, the design of its cells and support circuits has to be compromised in order to account for resistance-induced ground shifts which cause random malfunctioning. The prior art has proposed low resistance buses to distribute power and ground to large scale integrated (LSI) circuitry. For instance, U.S. Pat. No. 3,808,475 discloses the addition of a metallic level for the sole purpose of distributing ground potential to circuit "macros." This is typical of the approach often used by the prior art, particularly in the case of bipolar LSI. This approach is expensive because of the fabrication cost of an extra metallic level and reductions in manufacturing yield by electrical shorts to other power distribution levels.

Thus, there is an economic incentive to solutions of the ground resistance problem that can be implemented without increasing the fabrication cost of the improved LSI chip.

In what follows, we propose a semiconductor ground distribution structure which substantially reduces the resistance to ground of devices belonging to an array. When said ground distribution is applied to MOSFET arrays fabricated from two layers of polysilicon material, it can be implemented using one of those polysilicon layers. Our invention then solves the ground resistance problem by capitalizing on already existing processes and hence it is cost effective.

OBJECTS OF THE INVENTION

In general, it is an object of the invention to provide an improved large scale integrated (LSI) circuit structure.

It is another object of the invention to provide an improved voltage distribution bus for large scale arrays of integrated circuits.

It is another object of the invention to improve the performance of LSI chips through the utilization of vertical structures.

It is another object of the invention to provide an improved voltage distribution bus for MOSFET LSI chips without increasing the complexity of their fabrication.

It is another object of the invention to devise a read-only memory (ROM) array taking advantage of the improved voltage distribution network.

SUMMARY OF THE INVENTION

Other objects, features and advantages of the invention are accomplished by a polycrystalline silicon (polysilicon) layer structure which comes into direct contact with the terminals or electrodes of devices embedded in a semiconductor chip. Advantage is taken of one of the conductive polysilicon layers produced by conventional double-layer polysilicon processes to construct said structure in a grid-like pattern. This conductive grid distributes ground potential from grounded pads on the chip periphery to internal devices. These devices are usually disposed in an array format. In one form, said grid sections the chip into a multitude of rectangular cells, not necessarily of equal linear dimensions, each cell encompassing one or more array devices. Device regions to be grounded are directly contacted by the columns and/or rows of said grid so as to efficiently use chip area.

One application of the disclosed ground distribution grid is to MOSFET ROM arrays fabricated using two layers of polysilicon. Each MOSFET of such array has a drain, source and gate region. For efficient use of the chip area, the drain and source regions of adjacent devices are usually merged. In the array, these merged drain and source regions are respectively connected between an output or sense line and ground at the point where a word line connected to gate regions crosses an output line. Whence, ROM array devices are sometimes referred to as crosspoints. ROM arrays permanently store words which are composed of binary bits. The binary contents of a ROM are written into its array by altering the conduction parameters of the MOSFET crosspoints during fabrication and involving only one masking operation. A convenient alteration is raising the MOSFET threshold voltage to prevent it from switching out of its output state in response to excitation by its word line. Conversely, switching to the complementary output state is obtained from those MOSFETs with unaltered threshold voltage. In order to select a word line and read information out of the array, addressing, decoding and sensing MOSFET circuits are included on the chip, peripheral to the array. They are commonly referred to as support circuits.

Array MOSFETs are compactly disposed, chain-like, in elongated row regions. Within a row, successive gate regions have alternatively disposed therebetween drain and source regions which are then common to every pair of successive gates. To avoid ambiguous switching signals at said common drain regions, each gate region within a row is connected to a distinct word line whose other bit-storing crosspoint MOSFETs are located at the same location in the remaining rows of the array.

The proposed ground grid is incorporated into the herein above ROM organization by advantageous modifications of the conventional double-polysilicon processes used in fabricating one-transistor (1-T) memory cells. The essential modification is the addition of an extra masking-etching operation to open periodically disposed holes in oxide covered row regions. Then, doping impurities provided by the subsequently deposited first-polysilicon layer diffuse therethrough and thereby form source regions in direct contact with the ground distribution grid which is etched out of said first-polysilicon layer. After appropriate thicknesses of isolating and gate oxide layers have been formed, a second polysilicon layer is deposited and etched to produce word lines orthogonally crossing said rows and forming therein gate regions over said gate oxide layers. Then, as typically done in the fabrication of polysilicon-gate MOSFETs, self-aligned drain regions are formed in those gate oxide regions remaining uncovered. Finally, connections to the array and ground grid are completed. In the array, metal lines are disposed over each row, connecting all drain regions therein to output ports; while the periphery of the grid is connected to chip pads supplying ground potential.

DESCRIPTION OF THE FIGURES

These and other objects, features and advantages of the invention will be more fully appreciated with reference to the accompanying figures.

FIGS. 1A-1D are cross-sectional views of the proposed ground distribution structure shown connected to a row of MOSFET ROM array in various stages of fabrication by a double polysilicon process.

FIG. 1E shows a top view of the proposed ground distribution structure.

FIGS. 1F-1H show cross-sectional views of the final fabrication stages leading to the completion of a MOSFET ROM array connected to the proposed ground distribution structure.

FIG. 2 shows a cross-sectional view of the proposed ground distribution structure connected to a row of a MOSFET ROM array fabricated by an alternative double polysilicon process.

DISCUSSION OF THE PREFERRED EMBODIMENT

Figure 1F:
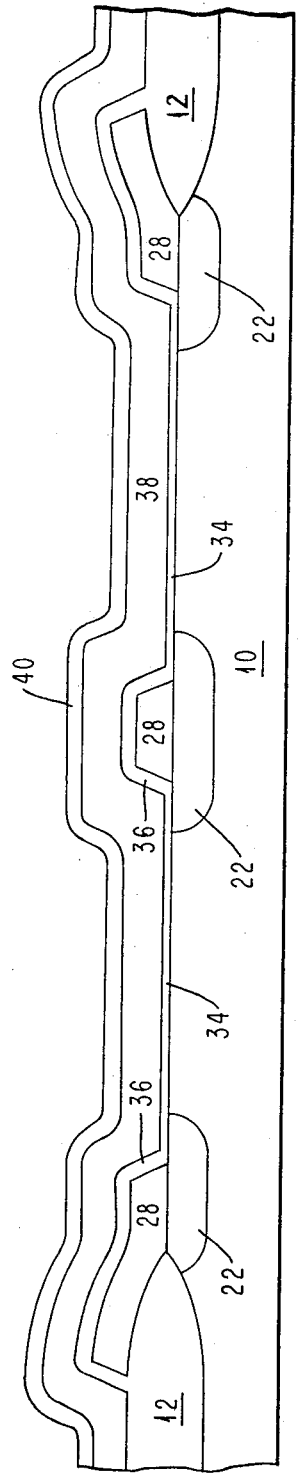

A semiconductor structure is described to distribute an externally supplied ground potential to a large number of MOSFET devices arranged in an array format on an LSI semiconductor chip. The structure consists of orthogonal lines, columns and rows, of conductive material, their intersections making contact to form an electrical grid. Electrodes of array MOSFETs that are to be grounded make direct contact to said columns, rows, or both, along their span while the end portion of the rows and columns, in turn, are contacted by metal buses extending from the chip ground pads. Hence, the total resistance between any contacted MOSFET and ground pads is the parallel combination of a plurality of cascading segments of columns and rows, and thus, any such MOSFET can be assumed to have a negligible resistance to ground and be free of noise or ground shifts. Array performance can then be enhanced without much regard for its size.

In what follows, the proposed ground distribution grid is implemented using a slightly modified double-polysilicon, self-aligned gate process as used in fabricating a type of one-transistor (1-T) memory cell for randome-access memory (RAM) arrays. In this 1-T cell type, first- and second-deposited polysilicon layers respectively go into the making of the upper electrode of the storage capacitor and the gate region of the MOSFET switch. Process compatibility with double-polysilicon 1-T cells is another desirable feature of the proposed ground grid structure; particularly, in LSI chips requiring arrays of RAM and ROM. Then in what follows, process compatibility of the ground grid preferred embodiment is illustrated with a ROM array simultaneously fabricated to benefit from that embodiment.

The illustrations of FIG. 1 show cross-sectional views of the preferred embodiment as part of a composite grid-ROM structure during important stages in the fabrication thereof. It will be assumed that the semiconductor wafer is silicon of p-type conductivity, although the proposed grid is equally capable of distributing ground potential over n-type substrates.

With reference to FIG. 1A, a p-type substrate 10 is depicted whose top surface has lost its initial planarity due to the formation of recessed thick oxide layers 12 obtained by well known masking, etching and oxidation techniques. Layers 12 partition the area of the ROM array into rectangular regions 14, elongated in one of the dimensions of the array, for instance the row dimension. Each long row region 14 is completely surrounded by layer 12 and thereby isolated from other neighboring rows or support circuitry on the array periphery. Within each one of these rows, crosspoint MOSFETs are to be located with all drain regions thereof connected to an output line, all source electrodes grounded, and each gate electrode connected to an individual word line. In the sequence of FIG. 1, four crosspoint MOSFETs are included in row 14; although in actual arrays, upwards of 100 devices are contained therein.

FIG. 1B shows the results of the first processing steps in preparation for constructing the preferred embodiment of the ground distribution grid. To start with, an oxide layer 16 is thermally grown to a thickness between 40 and 70 nm inside region 14. At this point, masking and etching operations of layer 16 are added to the conventional 1-T cell double-polysilicon process to open holes 18 wherever the ground grid is to contact the source region of the array MOSFETs. The boundaries of holes 18 are defined by the crossing of a mask determined rectangle with rows 14 so that holes 18 are walled by region 12 in the column direction.

Next in FIG. 1C, a first polysilicon layer 20 is deposited over the entire wafer. Layer 20 is somewhere between 300 and 500 nm thick and may be deposited by chemical-vapor deposition or evaporation. Layer 20 is now doped with n-type impurities such as arsenic, phosphorus, or antimony. A preferred choice in phosphorus from a deposited $POCL_3$ layer. The phosphorus makes layer 20 n-type and diffuses through holes 18 to form n-type regions 22 for the source electrodes of the array MOSFETs. Regions 22, having been formed after deposition of layer 20, are naturally self-aligned therewith for efficient use of the chip area. For instance, the contact areas 24 between layer 20 and source regions 22 extend across the full width of rows 14 inasmuch as holes 18 also do. This type of polysilicon-to-diffusion contact is commonly referred to as buried contact.

After depositing a 200 nm thick silicon oxide layer 26, a grid pattern is photoengraved on a layer of positive photoresist covering 26. The portions of 26 not protected by developed photoresist are removed in a bath of buffered hydrofluoric acid. With the grid pattern thus transferred to layer 26, the photoresist pattern is dissolved away and the etching of polysilicon layer 20 proceeds. Dry plasma etching of layer 20 is preferred since it can produce steeper sidewalls. A portion of the etched ground distribution grid is shown in the cross-sectional view of FIG. 1D taken along the a-a' plane of the top view in FIG. 1E. In FIG. 1D, the contact areas 24 of grid columns 28 to source regions 22 are shown within the borders of holes 18 and spaced therefrom by a clearance region 30. Enough clearance 30 is left to insure a minimum overlap between source regions 22 and corresponding gate regions to be subsequently formed out of the second polysilicon layer. As shown by the top view of FIG. 1E, grid columns 28 interconnect all source regions 22 located at the same location in rows 14. In turn, columns 28 are interconnected by rows 32 disposed on the thick oxide layer 12, not necessarily at regular intervals. In accordance with the invention, total resistance to ground from a crosspoint on a given column is decreased by forming a multitude of parallel current paths to ground. These paths are provided by intersecting row lines 32 and the connections thereof to adjacent columns. The total array area may increase as rows 32 are added depending on various process specifications. These include alignment tolerance in transferring grid pattern from mask to wafer surface, etching and oxidation tolerances, and taper angle of polysilicon sidewalls.

To complete the proposed grid structure, it only remains to form contacts on its periphery whereon external ground potential is applied. Before reaching that point, the fabrication of the crosspoint and support circuit MOSFETs must continue as follows. The remaining portions of silicon oxide layer 16 are removed by dip etching in buffered hydrofluoric acid. Then, a thermal oxide growth forms a 50 nm thick gate insulator layer 34 over the exposed substrate surface and about four-times thicker layer 36 over exposed polysilicon surfaces, both shown in FIG. 1F. Next, the maskless implantation of p-type doping ions is used to adjust the threshold voltage of all devices to meet circuit specifications. Typical parameters for this implant are $2 \times 10^{12}$ ions/cm$^2$ of B+ at 50 Kev. Additional implantation of selected crosspoint MOSFETs follows to permanently store in the array the binary contents of the ROM. The threshold voltage of those MOSFETs that are to store binary "0" is sufficiently raised to bring about a permanent "OFF" condition under the normal operating bias conditions of the array. The remaining array and support MOSFETs are masked against this implantation and therefore operate normally.

Next, a second polysilicon layer 38 is deposited to a thickness of about 400 nm and doped with n-type impurities using the same techniques mentioned in connection with layer 20. After doping, a layer 40 of silicon oxide, 200 to 300 nm thick, is grown or, preferably, deposited onto polysilicon layer 38 as shown in FIG. 1F. Masking and etching of layers 38 and 40, as herein above described for layers 20 and 26, yields gate electrodes for MOSFETs in the area of support circuitry and word lines in the array. These word lines are disposed orthogonally to rows 14, in the column direction. Thus, they alternatively cover regions of thick oxide 12 and gate insulator 34, the latter portion forming gate regions 42 of the cross-point MOSFETs shown in FIG. 1G. As illustrated therein, polysilicon word lines 44 overlap adjacent ground grid columns 28 in the interest of reducing array area and facilitating gate-source overlap without needing a large clearance 30 in FIG. 1D.

Figure 1G:
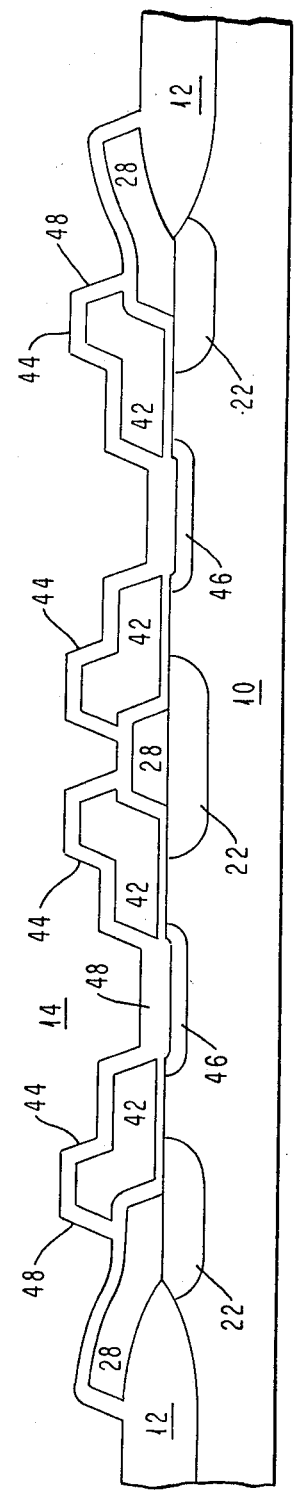

The wafer is then exposed to a maskless ion implantation to deposit sources of n-type dopant ions which after a thermal drive-in form diffused drain regions 46 in the array area, as shown in FIG. 1G, and source-drain regions for the support circuit MOSFETs. During this thermal drive-in, an oxide layer 48, between 200 to 300 nm thick, grows over drain regions 46 and the sidewalls of the polysilicon word lines, 44.

Next, masking and etching operations provide contact holes to allow subsequent metallic connections to diffused drain-source regions and said first and second polysilicon layers in both the array and support circuitry area of the chip. In the case of the first polysilicon layer, a set of contact holes are located at the peripheral boundaries of the ground grid, preferably at both terminals of each one of its columns and rows. These holes are subsequently contacted by metallic bus lines extending from chip pads at ground potential. Thus, with ground potential supplied to all terminations of columns and rows, the grid potential distribution is multi-symmetrical and, therefore, the total resistance to ground from any one array crosspoint is fairly independent of its location.

Next, the metallic-type interconnection material 52 of FIG. 1H, preferably aluminum, is deposited and then etched to obtain lines interconnecting the contact holes previously opened. Lines 52, running over contact holes 50, interconnect all drain regions 46 in a given row to corresponding output ports of the array. On the outlying regions of the chip, lines are laid to interconnect array word lines and output ports to support circuits and pads.

While the invention has been particularly described and shown in its application to MOSFET ROM arrays, it will be understood that it is also applicable and beneficial to other types of arrays such as erasable programmable read-only memories, programmable logic arrays and shift registers. Furthermore, changes to the preferred embodiment and its fabrication may be made without departing from the spirit of the invention. For instance, a ground distribution grid can be alternatively fabricated out of the second polysilicon layer and still maintain process compatibility with a type of 1-T cell wherein the first polysilicon layer provides the gate region of the MOSFET switch and the second polysilicon layer provides the upper electrode of the storage capacitor. Details on the fabrication and structure of this type of 1-T cell are taught by L. V. Rideout in U.S. Pat. No. 4,075,045, assigned to IBM.

FIG. 2 is a counterpart to FIG. 1H, arrived at after following the major steps of the double polysilicon process taught by Rideout with some modifications. The reference numerals of the structural elements of FIG. 1H have been primed for use on their counterparts of FIG. 2. As in the fabrication sequence of FIG. 1, the main deviation from the original 1-T process is the addition of one extra masking-etching operation. In this instance, these operations are used in opening holes 18' to allow the second polysilicon layer to come in direct contact with source regions 22'. Unlike FIG. 1, source regions 22' are diffused prior to the deposition of the ground-grid-forming second polysilicon layer. Consequently, the self-alignment obtained between columns 28 and source regions 22 in FIG. 1 is missing from FIG. 2. The tolerance associated with aligning holes 18' within source region 22' does not necessarily imply that rows 14' are more area-consuming than their counterparts 14 since the latter are impacted by the clearance regions 30 which are absent from the structure in FIG. 2.

The use of polysilicon material as an interconnection medium and source of doping impurities in the fabrication of the preferred embodiment of our invention is also part of the art of making emitter regions for bipolar transistors as reported, for instance, by K. Okada, K. Aomura, M. Suzuki, and H. Shiba in "PSA-A New Approach for Bipolar LSI, "*IEEE Journal of Solid-State Circuits*, Volume SC-13, October 1978, pp. 693–698. The making of such bipolar transistor yields polysilicon extensions self-aligned with respect to the emitter regions. Thus, arrays of such bipolar structures can economically incorporate the proposed ground distribution grid by applying the principles of the invention to said emitter-connected polysilicon layer.

Furthermore, it should be understood that the conductive layer 20 and columns 28 and rows 32 formed therefrom may also be composed of a refractory metal such as Mo, Pd, Pt, W or a metal silicide formed from such a metal.

Having thus described our invention, what we claim as new, and desire to secure by Letters Patent is:

1. A process for making an improved voltage distribution system on a large scale integrated circuit chip, comprising the steps of:

forming a layer of thick oxide on the surface of a silicon semiconductor substrate of first conductivity type with a plurality of first openings therein arranged in a rectilinear array;

forming a first and a second mutually separated oxide layers on the surface of said semiconductor substrate within each of said first openings, forming a common region therebetween, a first outer region between said first oxide layer and said thick oxide and a second outer region between said second oxide layer and said thick oxide;

forming a first polycrystalline silicon layer of second conductivity type, over all exposed surfaces;

diffusing a dopant of second conductivity type into said polycrystalline silicon layer, through said polycrystalline silicon layer into said substrate in said common region, forming a common diffusion of said second conductivity type, through said polycrystalline silicon layer into said substrate in said first outer region, forming a first outer diffusion of said second conductivity type, and through said polycrystalline silicon layer into said substrate in said second outer region, forming a second outer diffusion of said second conductivity type;

etching a grid pattern in said first polycrystalline silicon layer, forming second openings therein over said first and second oxide layers surrounded by a rectilinear grid of polycrystalline silicon conduction lines which are self-aligned with and in electrical contact with said common diffusion and said first and second outer diffusions in each of said first openings in said thick oxide layer, with said conduction lines in adjacent ones of said first openings electrically connected together; and forming semiconductor devices in each of said second openings, which are electrically connected to a respective one of said common diffusions therein and a proximate one of said outer diffusions therein;

whereby said rectilinear grid of polycrystalline silicon conduction lines forms an improved voltage distribution among said semiconductor devices may be achieved.

2. The process of claim 1, wherein said step of forming semiconductor devices, further comprises the steps of;

removing portions of said first and second oxide layers exposed through said second openings and growing a thin gate oxide layer therein on the surface of said substrate;

forming a protective oxide layer over all exposed surfaces of said polycrystalline silicon layer;

forming a conductive layer over all exposed surfaces;

etching said conductive layer to form gate electrodes on said gate oxide layer, each gate electrode having a first edge overlapping either one of said common diffusions or one of said outer diffusions which will serve as a first source/drain element of an FET device; and ion implanting said chip with a second conductivity type dopant to form a second source/drain element of said FET device, a second edge of each of said gate electrodes opposite to the respective said first edge thereof, serving as an implant mask to define a self-aligned edge of said second source/drain element with respect to said second edge of said gate electrode;

whereby FET devices are formed in each of said second openings, which are electrically connected to said conduction lines.

3. The process of claim 2, wherein a pair of FET devices are formed within each of said second openings, which share said respective second source/drain element, a first FET device of said pair employing a respective one of said common diffusions as its first source/drain element and a second FET device of said pair employing a respective, proximate one of said outer diffusions as its first drain/source element.

* * * * *